(12) United States Patent
Chen et al.

(10) Patent No.: US 8,330,538 B2
(45) Date of Patent: Dec. 11, 2012

(54) SELF-OSCILLATING AUDIO AMPLIFIER AND METHOD FOR RESTRAINING THE IMPROVED SELF-OSCILLATING AUDIO AMPLIFIER

(75) Inventors: Ming-Hsiung Chen, Taipei (TW); Shang-Shu Chung, Taipei (TW); Tung-Sheng Ku, Taipei (TW)

(73) Assignee: Amazing Microelectronic Corp. (TW)

( * ) Notice: Subject to any disclaimer, the term of this patent is extended or adjusted under 35 U.S.C. 154(b) by 669 days.

(21) Appl. No.: 12/616,370

(22) Filed: Nov. 11, 2009

(65) Prior Publication Data
US 2011/0110539 A1 May 12, 2011

(51) Int. Cl.
*H03F 3/38* (2006.01)
*H03F 3/217* (2006.01)
*H03F 1/04* (2006.01)
*H04R 5/00* (2006.01)

(52) U.S. Cl. .......... 330/10; 330/251; 330/207 A; 381/28
(58) Field of Classification Search ............... 381/28; 330/10, 251, 207 A
See application file for complete search history.

(56) References Cited

U.S. PATENT DOCUMENTS
2008/0284508 A1 * 11/2008 Walker et al. ............ 330/10

* cited by examiner

*Primary Examiner* — Yuwen Pan
*Assistant Examiner* — George Monikang

(57) ABSTRACT

An improved self-oscillating audio amplifier and a method for restraining audio distortion of the self-oscillating audio amplifier are disclosed. The improved self-oscillating audio amplifier comprises a distortion restraint unit configured to detect whether modulated audio signals outputted from the self-oscillating audio amplifier is distorted and, if so, to restrain the distortion. The method for restraining audio distortion of the self-oscillating audio amplifier includes the following steps of: determining whether the modulated audio signals outputted from an audio amplifier positive output terminal is distorted by a first flip-flop set, and if yes, restraining the distortion of the modulated audio signals outputted from the audio amplifier positive output terminal; and outputting the modulated audio signals to drive a speaker by the audio amplifier positive output terminal and an audio amplifier negative output terminal.

13 Claims, 14 Drawing Sheets

SELF-OSCILLATING AUDIO AMPLIFIER AND METHOD FOR RESTRAINING THE IMPROVED SELF-OSCILLATING AUDIO AMPLIFIER

BACKGROUND OF THE INVENTION

1. Technical Field

The present invention relates to a self-oscillating audio amplifier, and more particularly, to a self-oscillating audio amplifier capable of restraining distortion, and a method for restraining audio distortion of the self-oscillating audio amplifier.

2. Description of Related Art

Audio amplifiers play an important role in driving speakers, and common audio amplifiers include Class AB amplifiers and Class D amplifiers. The Class D amplifiers deliver an efficiency that is twice to five times higher than that of the Class AB amplifiers. Moreover, as compared to the Class AB amplifiers, power dissipation and required power of the Class D amplifiers are dramatically decreased.

Primarily, a Class D amplifier amplifies an audio signal by employing the pulse width modulation (PWM) technology to transform audio signals into an on/off status control signals for controlling the on/off status of power electronic components. Besides, an inductor-capacitor (LC) filter incorporated in the Class D amplifier itself can store sufficient energy in each operation period of the Class D amplifier, so as to avoid power dissipation at a load end (e.g., a speaker) of the Class D amplifier when the on/off status of power electronic components are being controlled.

According to the PWM technology employed in the Class D amplifier, triangular wave signals are generated through self-oscillation of an integrator or by means of a triangular wave generator, and then a comparison is made by a comparator to output PWM signals. As shown in FIG. 1 which is a circuit diagram of a conventional self-oscillating audio amplifier, the self-oscillating audio amplifier 100 mainly comprises: an audio signal 104, a clock switch 128, a clock input source 116, a sub-audio amplifier 106, a pre-driver 108, a transistor set 110, a filter inductor 112, a filter capacitor 114 and a speaker 120. Further, as shown in FIG. 2 which is a circuit diagram of the sub-audio amplifier 106 of the conventional self-oscillating audio amplifier, the sub-audio amplifier 106 mainly consists of a resistor 124, a capacitor 134, a comparator 122 and a comparator 132. The sub-audio amplifier 106 is configured to transform the audio signals into the triangular wave signals and, by means of the comparator 132, compares the triangular wave signals against an externally applied reference voltage VREF so that the comparator 132 can output pulse-modulated signals.

The conventional self-oscillating audio amplifier 100 as described above accomplishes the goals of audio amplification and pulse modulation by means of self-oscillation of the sub-audio amplifier 106. This allows for outputting the audio signals to the speaker 120 in a high efficiency and responding to the inputted audio signals through the feedback resistor. However, although the integrator circuit is able to self-oscillate in the absence of input audio signals to present less distortion, it is impossible to restrain distortion of the audio signals caused by a too high output power.

Accordingly, in view of the shortcomings of the conventional self-oscillating audio amplifiers, the inventor of the present invention has made great efforts to make improvement thereon and finally provides an improved self-oscillating audio amplifier and a method for restraining distortion of the improved self-oscillating audio amplifier.

SUMMARY OF THE INVENTION

The primary objective of the present invention is to provide an improved self-oscillating audio amplifier which, by use of a distortion restraint circuit, detects and effectively restrains audio signal distortion at the output end.

Another objective of the present invention is to provide a method for restraining audio distortion of a self-oscillating audio amplifier. According to this method, a simple combination of a logic gate and a flip-flop is used to prevent audio signal distortion caused by a high output gain of the audio amplifier, thereby maintaining a high-quality output of the speaker.

To accomplish the primary objective described above, an improved self-oscillating audio amplifier is provided, which comprises: an signal amplifier unit; at least one self-oscillation modulation unit; at least one gate drive unit; at least one output stage transistor set; an audio amplifier positive output terminal; an audio amplifier negative output terminal; and a distortion restraint unit. The distortion restraint unit further comprises at least one D flip-flop and at least one XNOR logic gate.

Also, to accomplish the another objective described above, a method for restraining audio distortion of a self-oscillating audio amplifier is provided, which comprises the following steps of: (1) receiving and amplifying audio signals by a signal amplifier unit; (2) receiving amplified audio signals by a self-oscillation modulation unit to perform pulse modulation; (3) receiving pulse-modulated signals from the self-oscillation modulation unit by a gate drive unit to control an output stage transistor set; (4) outputting modulated audio signals by the output stage transistor set to an audio amplifier positive output terminal and an audio amplifier negative output terminal; (5) determining whether the modulated audio signals outputted from the audio amplifier positive output terminal is distorted by a first flip-flop set, and if yes, proceeding to step (6), and otherwise, proceeding to step (7); (6) restraining distortion of the modulated audio signals outputted from the audio amplifier positive output terminal, and proceeding to step (9); (7) determining whether the modulated audio signals outputted from the audio amplifier negative output terminal is distorted by a second flip-flop set, and if yes, proceeding to step (8), and otherwise, proceeding to step (9); (8) restraining distortion of the modulated audio signals outputted from the audio amplifier negative output terminal; and (9) outputting the modulated audio signals by the audio amplifier positive output terminal and the audio amplifier negative output terminal for driving a speaker.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To explain the improved self-oscillating audio amplifier and the method for restraining audio distortion of the self-oscillating audio amplifier of the present invention more clearly, detailed description will be made hereinbelow with reference to the attached drawings.

Figure 1:
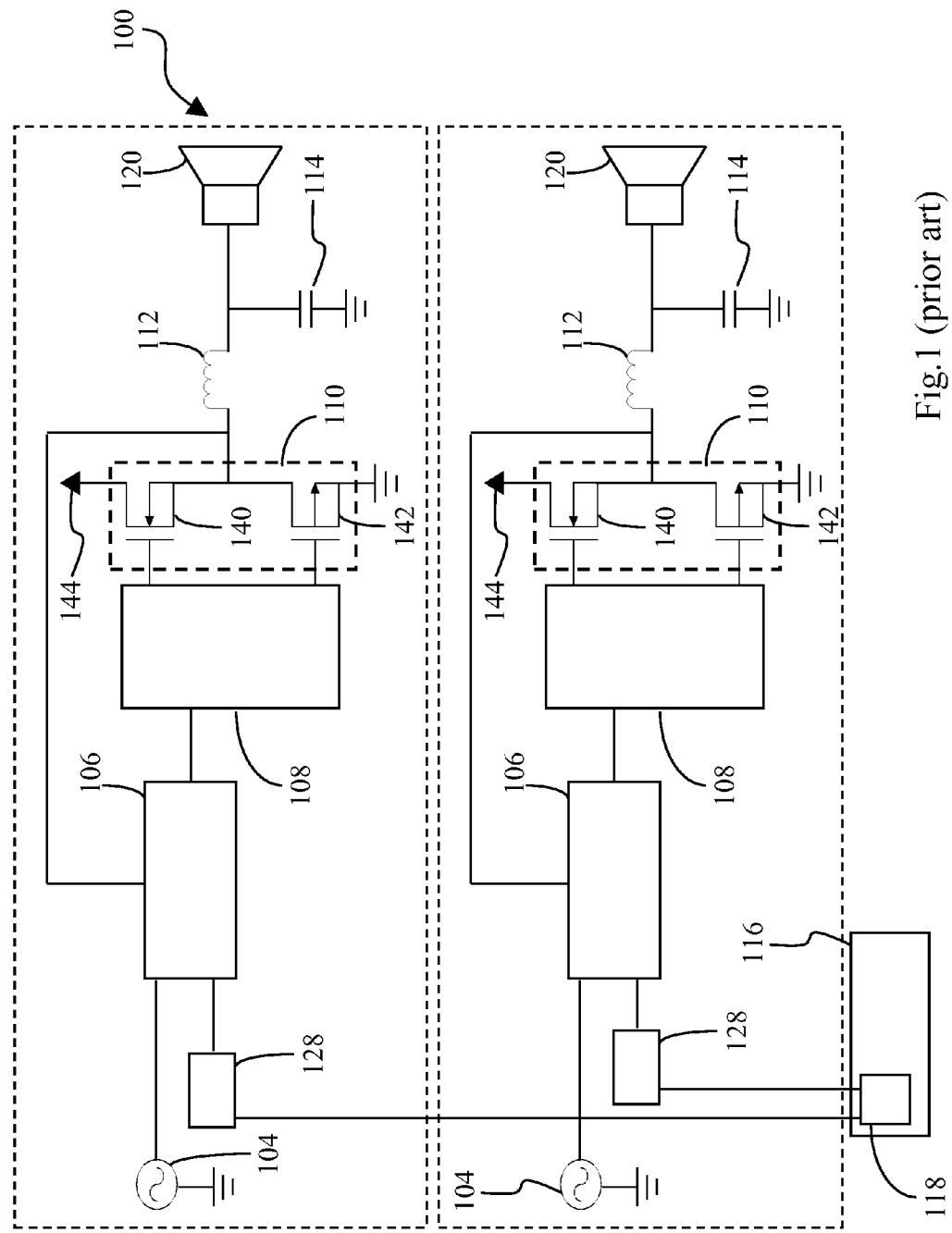
FIG. 1 is a circuit diagram of a conventional self-oscillating audio amplifier.
Figure 2:
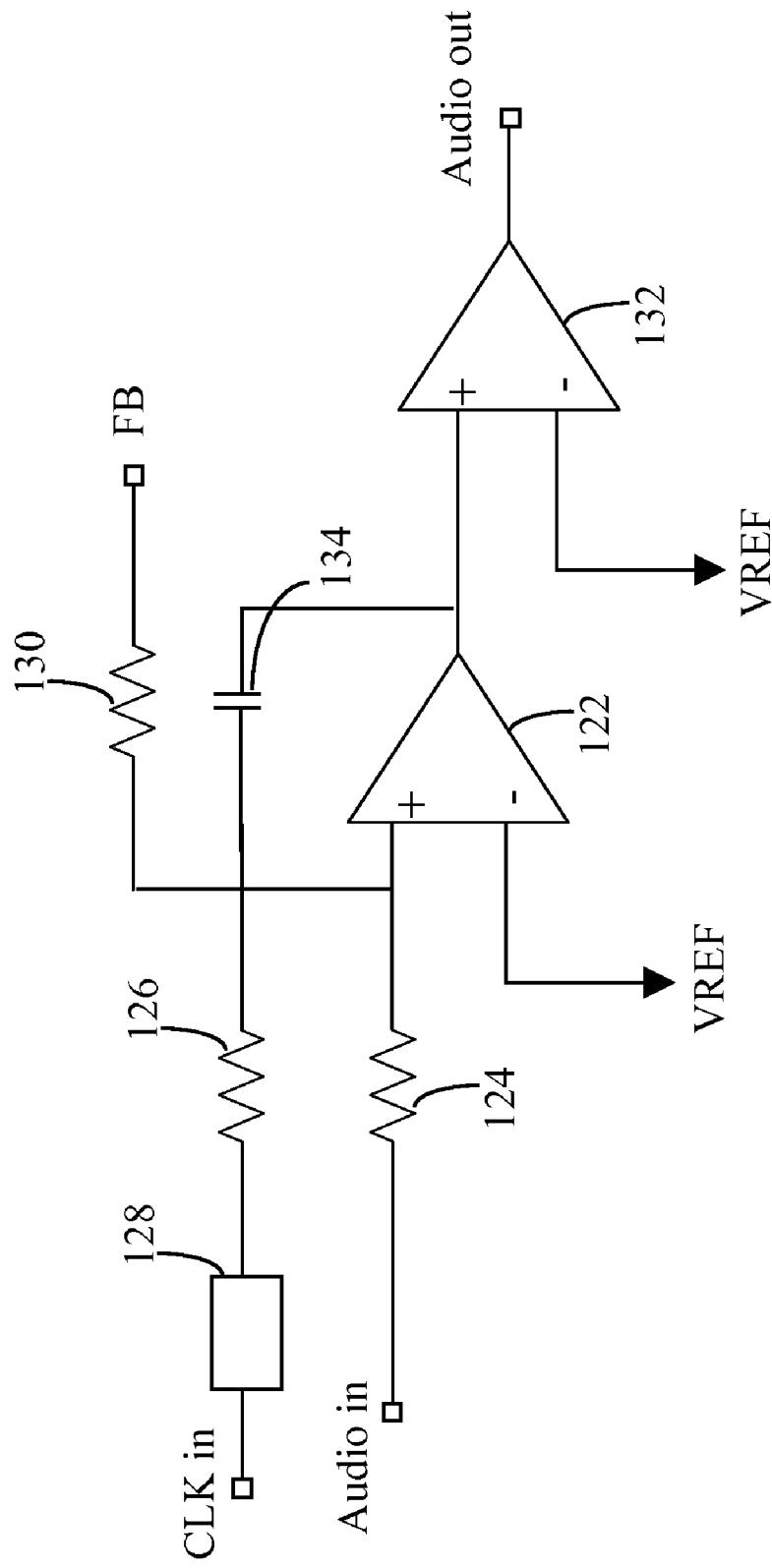
FIG. 2 is circuit diagram of a sub-audio amplifier of the conventional self-oscillating audio amplifier.
Figure 3:
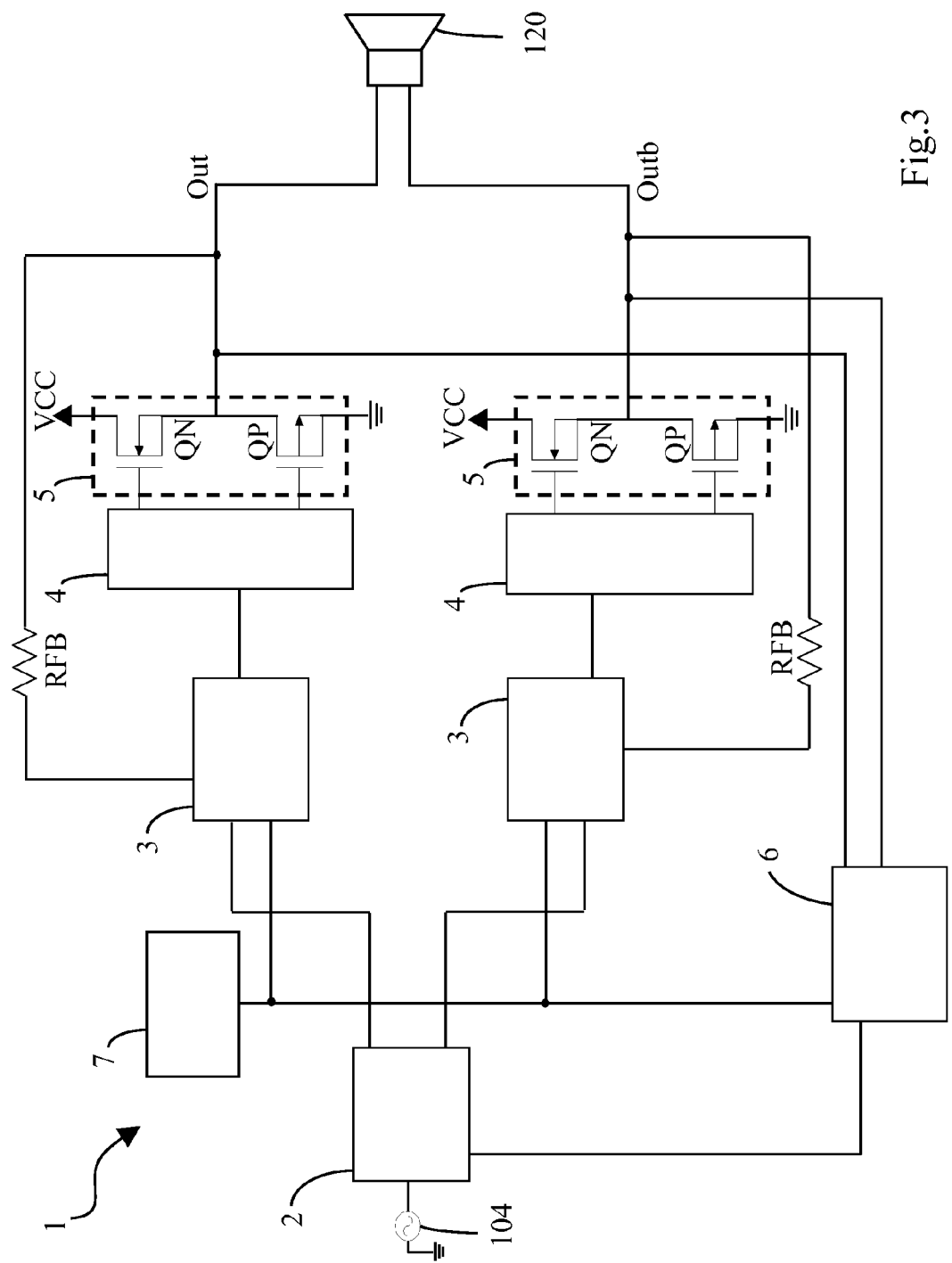
FIG. 3 is a circuit diagram of an improved self-oscillating audio amplifier according to the present invention.

Referring to FIG. 3, there is shown a circuit diagram of an improved self-oscillating audio amplifier according to the present invention, which preferably comprises: a signal amplifier unit 2, two self-oscillation modulation units 3, two gate drive units 4, two output stage transistor sets 5, an audio amplifier positive output terminal Out, an audio amplifier negative output terminal Outb, a distortion restraint unit 6, two feedback resistors RFB, and a clock unit 7.

Figure 4:
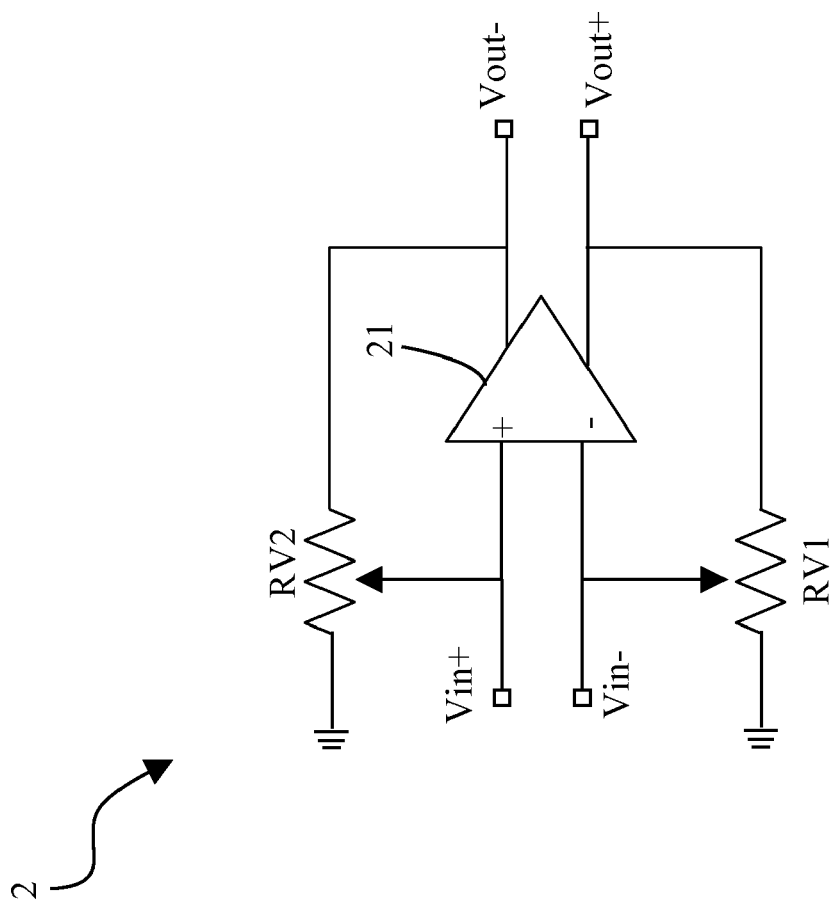
FIG. 4 is a circuit diagram of a signal amplifier unit according to the present invention.

The signal amplifier unit 2 is coupled to an audio source 104 to receive audio signals and amplify it into amplified audio signals. Referring also to FIG. 4, there is shown a circuit diagram of the signal amplifier unit. The signal amplifier unit 2 comprises a fully differential amplifier 21, a first variable resistor RV1 and a second variable resistor RV2. Wherein, the fully differential amplifier 21 comprises a differential amplifier positive input terminal Vin+, a differential amplifier negative input terminal Vin−, a differential amplifier positive output terminal Vout+ and a differential amplifier negative output terminal Vout−. The differential amplifier positive input terminal Vin+ and the differential amplifier negative input terminal Vin− are coupled to the audio source 104 to receive the audio signals, while the differential amplifier positive output terminal Vout+ and the differential amplifier negative output terminal Vout− are coupled to a self-oscillation modulation unit 3 respectively. The fully differential amplifier 21 is configured to amplify the audio signals to output the amplified audio signals to the self-oscillation modulation unit 3. The first variable resistor RV1 is coupled between the differential amplifier positive input terminal Vin+ and the differential amplifier negative output terminal Vout− and, by adjusting resistance of the first variable resistor RV1, an output gain of the amplified audio signals outputted by the differential amplifier negative output terminal Vout− can be modulated. The second variable resistor RV2 is coupled between the differential amplifier negative input terminal Vin− and the differential amplifier positive output terminal Vout+, and by adjusting resistance of the second variable resistor RV2, the output gain of the amplified audio signals outputted by the differential amplifier positive output terminal Vout+ can be modulated.

Figure 5:
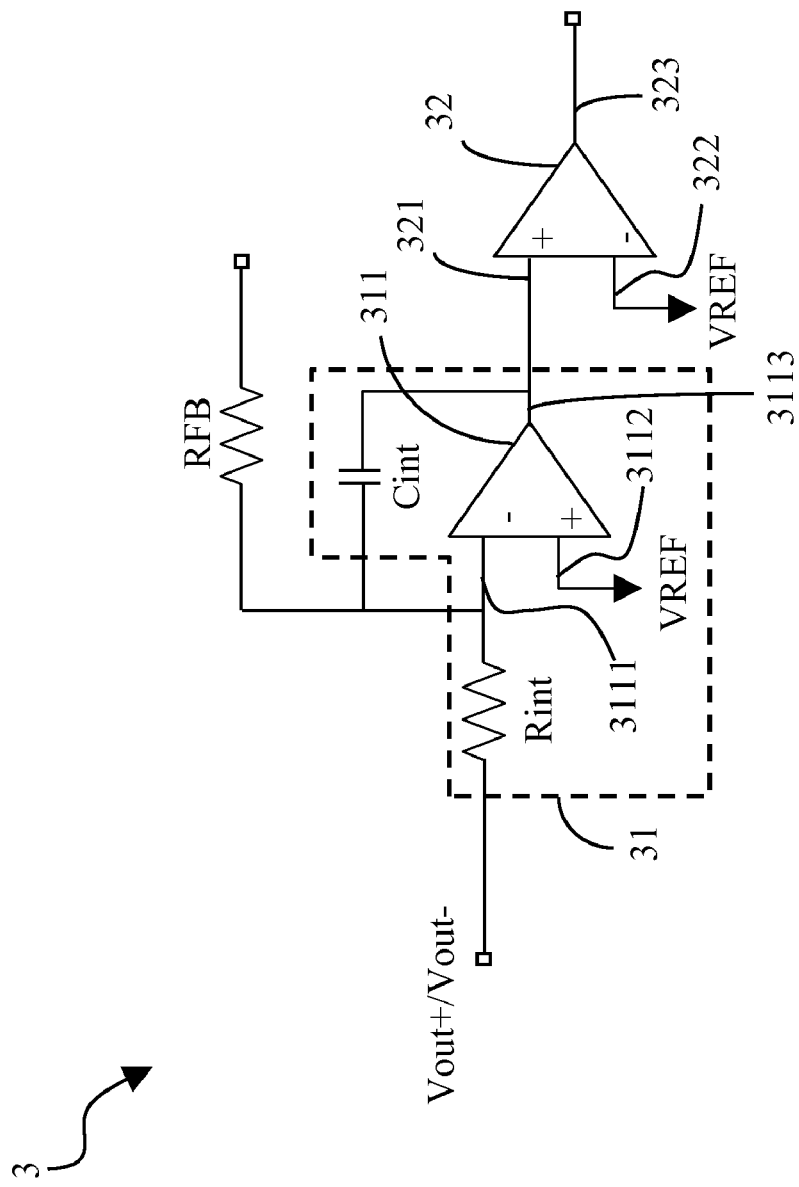
FIG. 5 is a circuit diagram of a self-oscillation modulation unit according to the present invention.

The two self-oscillation modulation units 3 are coupled to the signal amplifier unit 2 to receive the amplified audio signals and configured to perform pulse modulation on the amplified audio signals in a self-oscillating way to output pulse-modulated signals. Referring also to FIG. 5, there is shown a circuit diagram of one of the self-oscillation modulation units. The self-oscillation modulation unit 3 comprises an integrator 31 and a comparator 32. The integrator 31 is connected to the signal amplifier unit 2 to receive the amplified audio signals, and is configured to generate self-oscillation for transforming the amplified audio signals into triangular wave signals. The integrator 31 comprises: an integrator resistor Rint, being coupled to the signal amplifier unit 2 for using as a buffer interface of inputting the amplified audio signals into the integrator 31; an integrator capacitor Cint, being coupled to the integrator resistor Rint and configured to be charged and discharged when the amplified audio signals being inputted into the integrator 31 via the integrator resistor Rint; and an operational amplifier (OPA) 311, which has an operational amplifier positive input terminal 3112, an operational amplifier negative input terminal 3111 and an operational amplifier output terminal 3113. The operational amplifier positive input terminal 3112 is coupled to an externally applied reference voltage VREF, while the operational amplifier negative input terminal 3111 is coupled to the integrator resistor Rint. When the integrator capacitor Cint is charged and discharged repeatedly, the triangular wave signals in a periodic nature being outputted by the operational amplifier 311. The comparator 32 has a comparator positive input terminal 321, a comparator negative input terminal 322 and a comparator output terminal 323. The comparator positive input terminal 321 is coupled to the operational amplifier output terminal 3113, the comparator negative input terminal 322 is coupled to the externally applied reference voltage VREF, and the comparator output terminal 323 is coupled to the gate drive unit 4. Upon receiving the triangular wave signals, the comparator 32 compares the triangular wave signals against the externally applied reference voltage VREF and outputs the pulse-modulated signals to the gate drive unit 4.

The two gate drive units 4 are coupled to the self-oscillation modulation units 3 to receive the pulse-modulated signals and configured to control the on/off status of the output stage transistor set 5 of the next stage according to the pulse-modulated signals.

The two output stage transistor sets 5 are coupled to the gate drive units 4 respectively. The gate drive units 4 receive the pulse-modulated signals outputted by the self-oscillation modulation units 3 and, according to the pulse-modulated signal, control the on/off status of the output stage transistor sets 5 so that the output stage transistor sets 5 output modulated audio signals to the audio amplifier positive output terminal Out and the audio amplifier negative output terminal Outb to drive a speaker 120.

Figure 6:
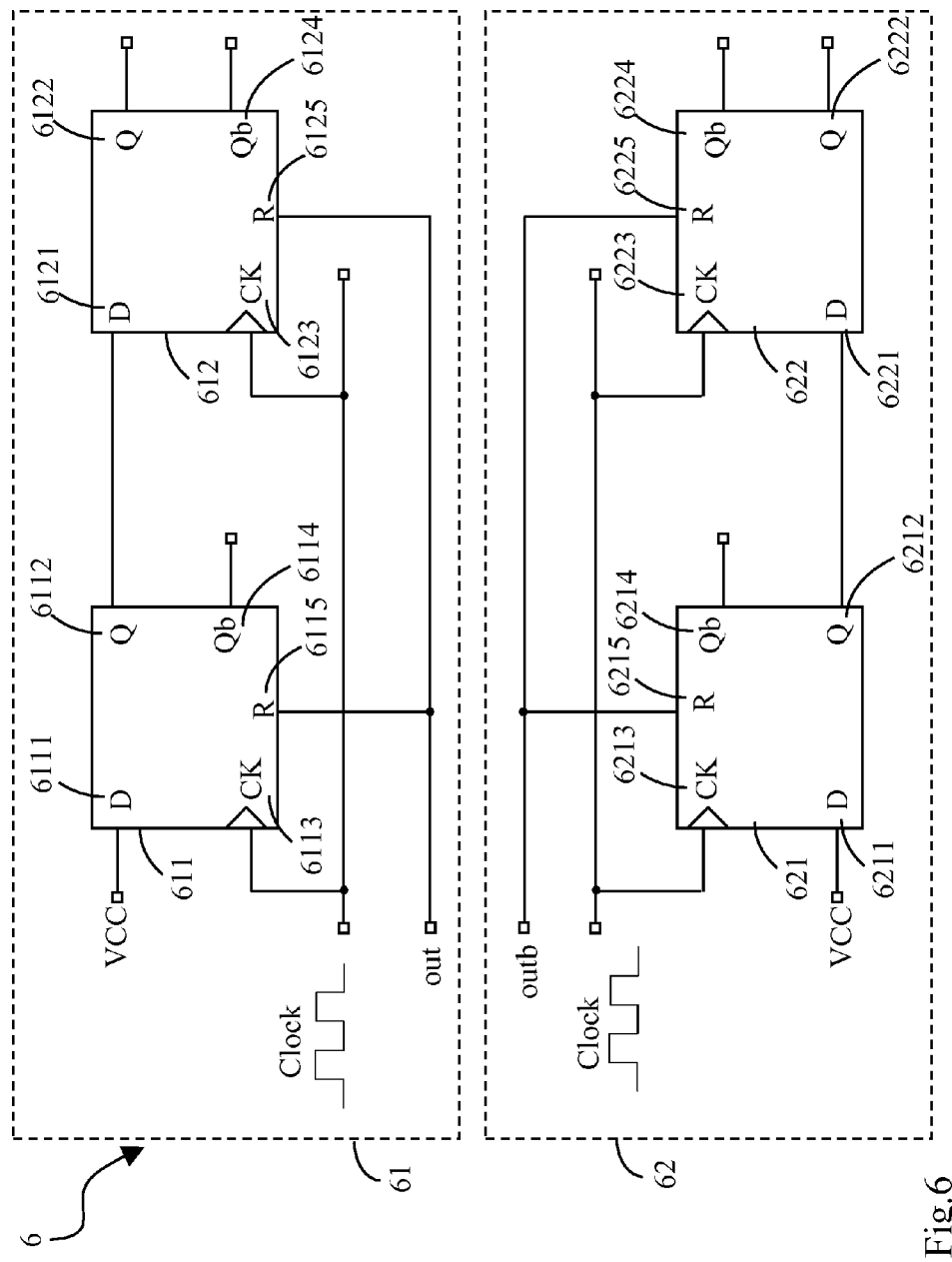
FIG. 6 is a circuit diagram of a distortion restraint unit according to the present invention.

The distortion restraint unit 6 is coupled to the audio amplifier positive output terminal Out, the audio amplifier negative output terminal Outb and the signal amplifier unit 2. The distortion restraint unit 6 is configured to detect whether the modulated audio signals outputted to the audio amplifier positive output terminal Out and the audio amplifier negative output terminal Outb is distorted and, if distorted, restrain the distortion. Referring also to FIG. 6, there is shown a circuit diagram of the distortion restrain unit. The distortion restraint unit 6 comprises a first flip-flop set 61 and a second flip-flop set 62. The first flip-flop set 61 is coupled to the audio amplifier positive output terminal Out and the signal amplifier unit 2 and configured to receive the modulated audio signals outputted by the output stage transistor set 5 to the audio amplifier positive output terminal Out. When the modulated audio signals have been maintained at a high (low) level for over two clock periods, the first flip-flop set 61 outputs a first adjustment signal to the signal amplifier unit 2 according to the characteristic response thereof to adjust the output gain of the amplified audio signals. The first flip-flop set 61 comprises a first D flip-flop 611 and a second D flip-flop 612. The first D flip-flop 611 comprises a first D terminal 6111, a first CK terminal 6113, a first Q terminal 6112, a first Qb terminal 6114 and a first R terminal 6115. The first D terminal 6111 is coupled to an externally applied operation voltage VCC, the first CK terminal 6113 is coupled to the clock unit 7 to receive clock signals, the first Qb terminal 6114 is in the floating status, and the first R terminal 6115 is coupled to the audio amplifier positive output terminal Out to receive the modulated audio signals outputted by the output stage transistor set 5 to the audio amplifier positive output terminal Out. When the modulated audio signals have been maintained at the high/low level for over two clock periods, the first D flip-flop 611 outputs, according to the characteristic response thereof, a first flip-flop signal to the second D flip-flop 612 of the next stage. The second D flip-flop 612 comprises a second D terminal 6121, a second CK terminal 6123, a second Q terminal 6122, a second Qb terminal 6124 and a second R terminal 6125. The second D terminal 6121 is coupled to the first Q terminal 6112 of the first D flip-flop 611 to receive the first flip-flop signal, the second CK terminal 6123 is coupled to the clock unit 7, the second Q terminal 6122 is coupled to the signal amplifier unit 2, the second Qb terminal 6124 is in the floating status, and the second R terminal 6125 is coupled to the audio amplifier positive output terminal Out to receive the modulated audio signals. When the modulated audio signals have been maintained at the high/low level for over two clock periods, the first flip-flop signal outputted from the first Q terminal 6122 will be received at the second R terminal 6125. Then, according to the characteristic response thereof, the second D flip-flop 612 outputs the first adjustment signal for feedback to the signal amplifier unit 2 to adjust the output gain of the amplified audio signals by adjusting the second variable resistor RV2, thereby eliminating the audio distortion. The second flip-flop set 62 is coupled to the audio amplifier negative output terminal Outb and the signal amplifier unit 2 and configured to receive the modulated audio signals outputted by the output stage transistor set 5 to the audio amplifier negative output terminal Outb. When the modulated audio signals have been maintained at a low (high) level for over two clock periods, the second flip-flop set 62 outputs a second adjustment signal to the signal amplifier unit 2 according to the characteristic response thereof to adjust the output gain of the amplified audio signals. The second flip-flop set 62 comprises a third D flip-flop 621 and a fourth D flip-flop 622. The third D flip-flop 621 comprises a third D terminal 6211, a third CK terminal 6213, a third Q terminal 6212, a third Qb terminal 6214 and a third R terminal 6215. The third D terminal 6211 is coupled to the externally applied operation voltage VCC, the third CK terminal 6213 is coupled to the clock unit 7, the third Qb terminal 6214 is in the floating status, and the third R terminal 6215 is coupled to the audio amplifier negative output terminal Outb to receive the modulated audio signals outputted by the output stage transistor set 5 to the audio amplifier negative output terminal Outb. When the modulated audio signals have been maintained at the low/high level for over two clock periods, the third D flip-flop 621 outputs, according to the characteristic response thereof, a third flip-flop signal to the fourth D flip-flop 622 of the next stage. The fourth D flip-flop 622 comprises a fourth D terminal 6221, a fourth CK terminal 6223, a fourth Q terminal 6222, a fourth Qb terminal 6224 and a fourth R terminal 6225. The fourth D terminal 6221 is coupled to the third Q terminal 6212 of the third D flip-flop 621 to receive the third flip-flop signal, the fourth CK terminal 6223 is coupled to the clock unit 7, the fourth Q terminal 6222 is coupled to the signal amplifier unit 2, the fourth Qb terminal 6224 is in the floating status, and the fourth R terminal 6225 is coupled to the audio amplifier negative output terminal Outb to receive the modulated audio signals. When the modulated audio signal have been maintained at the low/high level for over two clock periods, the third flip-flop signal outputted from the third Q terminal 6212 will be received at the fourth R terminal 6225. Then, according to the characteristic response thereof, the fourth D flip-flop 622 outputs the second adjustment signal for feedback to the signal amplifier unit 2 to adjust the output gain of the amplified audio signals by adjusting the first variable resistor RV1, thereby eliminating the audio distortion.

One of the two feedback resistors RFB is coupled between the audio amplifier positive output terminal Out and the self-oscillation modulation unit 3 while the other is coupled between the audio amplifier negative output terminal Outb and the self-oscillation modulation unit 3. The feedback resistors RFB are used to help in feeding back signals to the self-oscillation modulation unit 3.

Besides, the clock unit 7 is coupled to the distortion restraint unit 6 and the self-oscillation modulation unit to provide the clock signals.

Figure 7A:
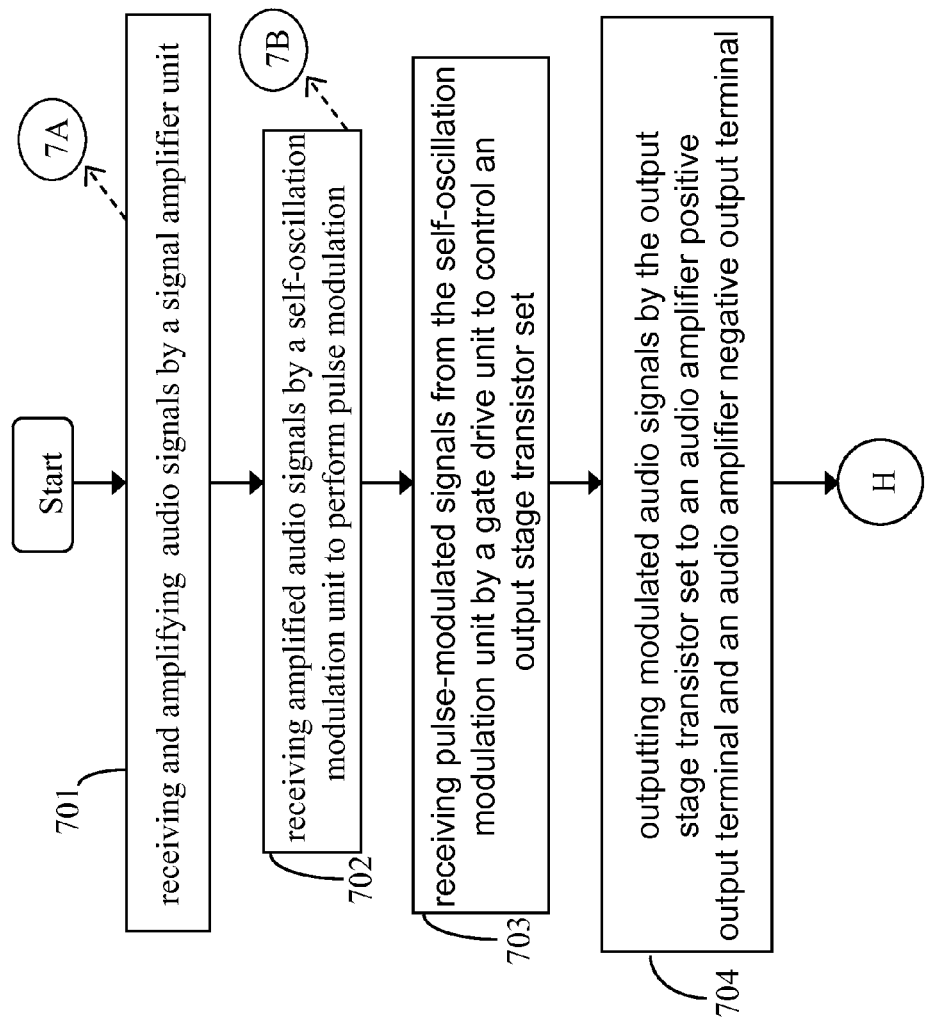
FIGS. 7A and 7B are a flowchart of a method for restraining audio distortion of the self-oscillating audio amplifier according to the present invention.
Figure 7B:
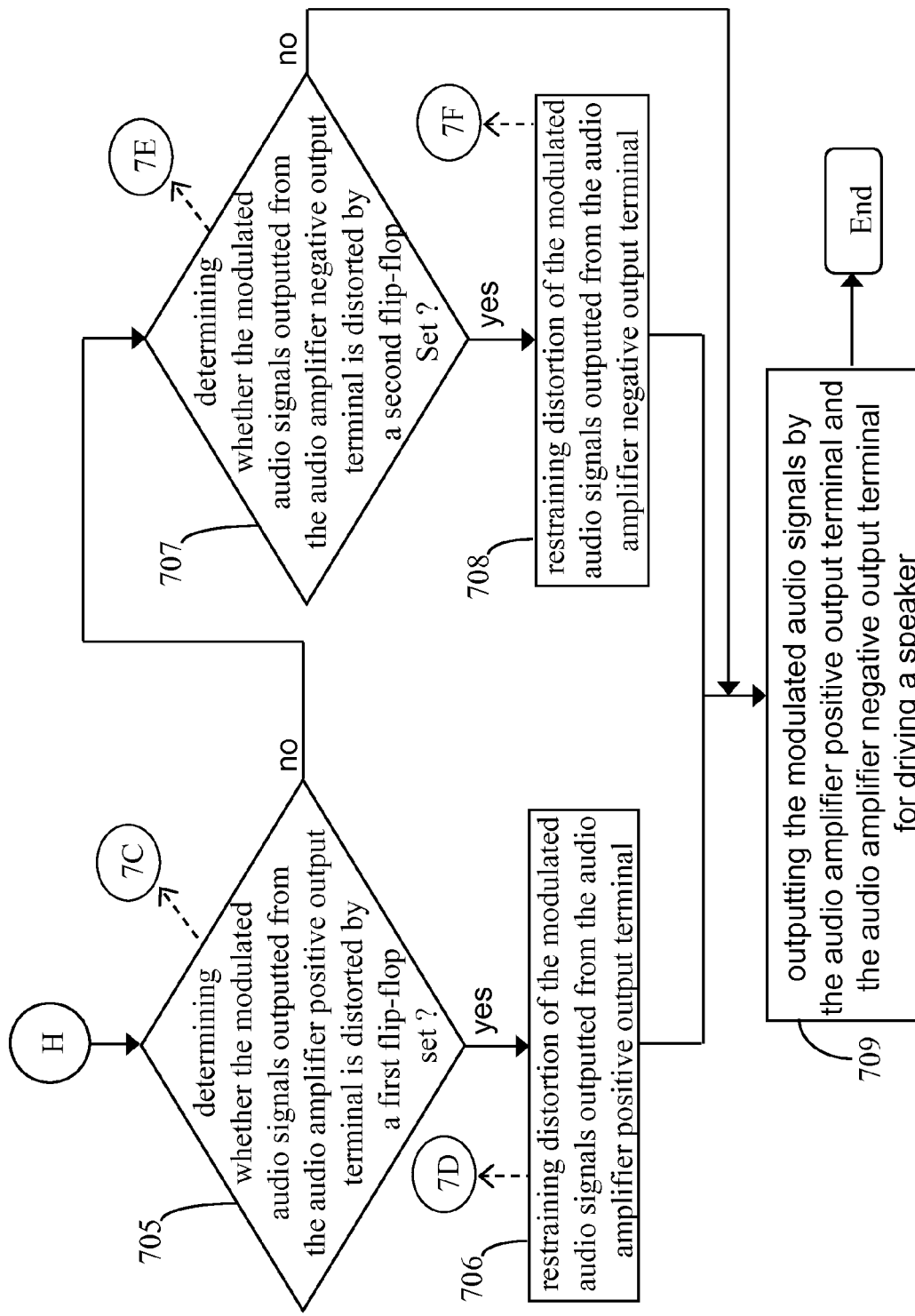

Having thus disclosed the circuit construction and functions of a preferred embodiment of the improved self-oscillation audio amplifier 1 clearly, referring next to FIGS. 7A and 7B, there is shown a flowchart of a method for restraining distortion of the self-oscillation audio amplifier. The method for restraining distortion of the self-oscillation audio amplifier comprises the following steps.

This method begins with step (701) where the signal amplifier unit 2 receives and amplifies the audio signals. Then in step (702), the self-oscillation modulation unit 3 receives the amplified audio signals to perform pulse modulation thereon. Next in step (703), a gate drive unit 4 receives pulse-modulated signals outputted by the self-oscillation modulation unit 3 to control the output stage transistor set 5. Subsequently in step (704), the output stage transistor set 5 outputs modulated audio signals to the audio amplifier positive output terminal Out and the audio amplifier negative output terminal Outb, and in step (705), the first flip-flop set 61 determines whether the modulated audio signals outputted at the audio amplifier positive output terminal Out is distorted. If the modulated audio signals are distorted, step (706) is executed to restrain distortion of the modulated audio signals outputted at the audio amplifier positive output terminal Out, and then step (709) is executed to output the modulated audio signals from the audio amplifier positive output terminal Out and the audio amplifier negative output terminal Outb to drive the speaker 120; otherwise, step (707) is executed where the second flip-flop set 62 determines whether the modulated audio signals outputted from the audio amplifier negative output terminal Outb is distorted. If the modulated audio signals are distorted, then step (708) is executed to restrain the distortion of the modulated audio signals outputted from the audio amplifier negative output terminal Outb and the method proceeds to step (709). Otherwise, it means that neither of the modulated audio signals outputted from the audio amplifier positive output terminal Out and the audio amplifier negative output terminal Outb is distorted, and there is no need to restrain distortion of the modulated audio signals; consequently, the method proceeds directly to step (709) where the modulated audio signals are outputted from the audio amplifier positive output terminal Out and the audio amplifier negative output terminal Outb to drive the speaker 120.

Figure 8:
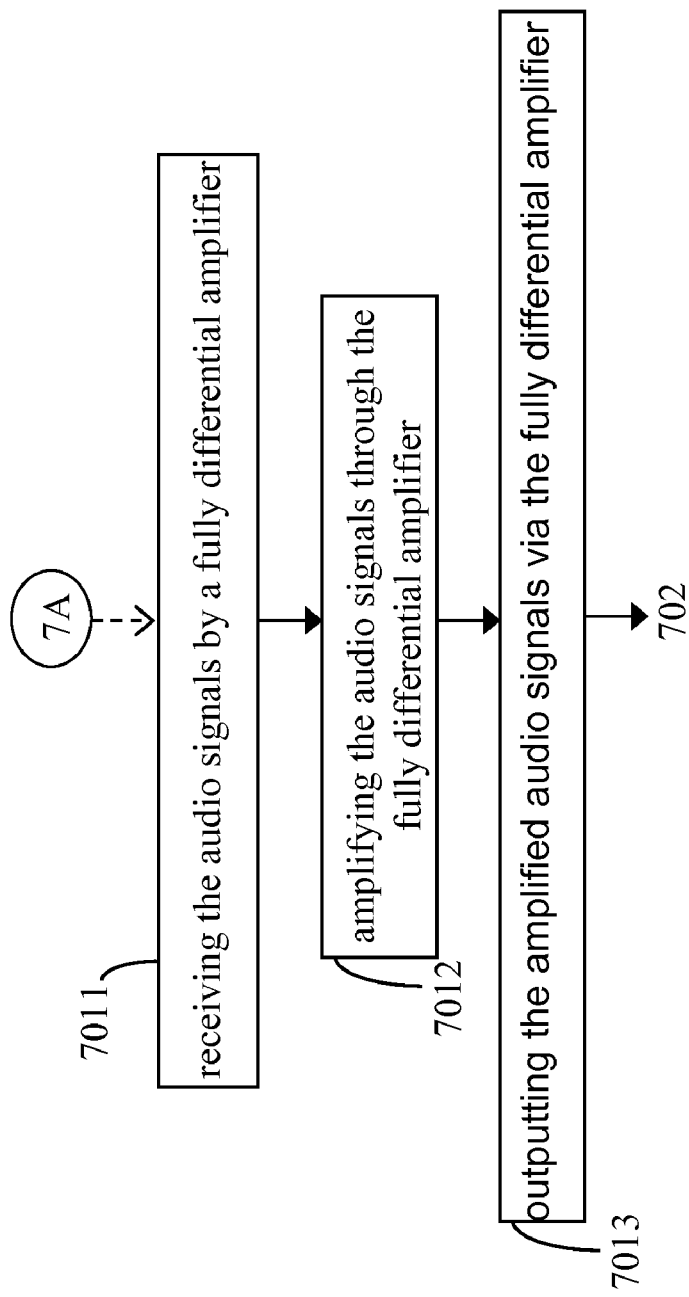
FIG. 8 is a detailed flowchart of step (701) according to the present invention.

Referring to FIG. 8, there is shown a detailed flowchart of step (701) of the method for restraining distortion of the self-oscillation audio amplifier. The step (701) further comprises the following steps.

Firstly in step (7011), the fully differential amplifier 21 receives the audio signals. Next in step (7012), the fully differential amplifier 21 amplifies the audio signals and in step (7013), the fully differential amplifier 21 outputs the amplified audio signals. Then the method proceeds to the next step, i.e., step (702).

Figure 9:
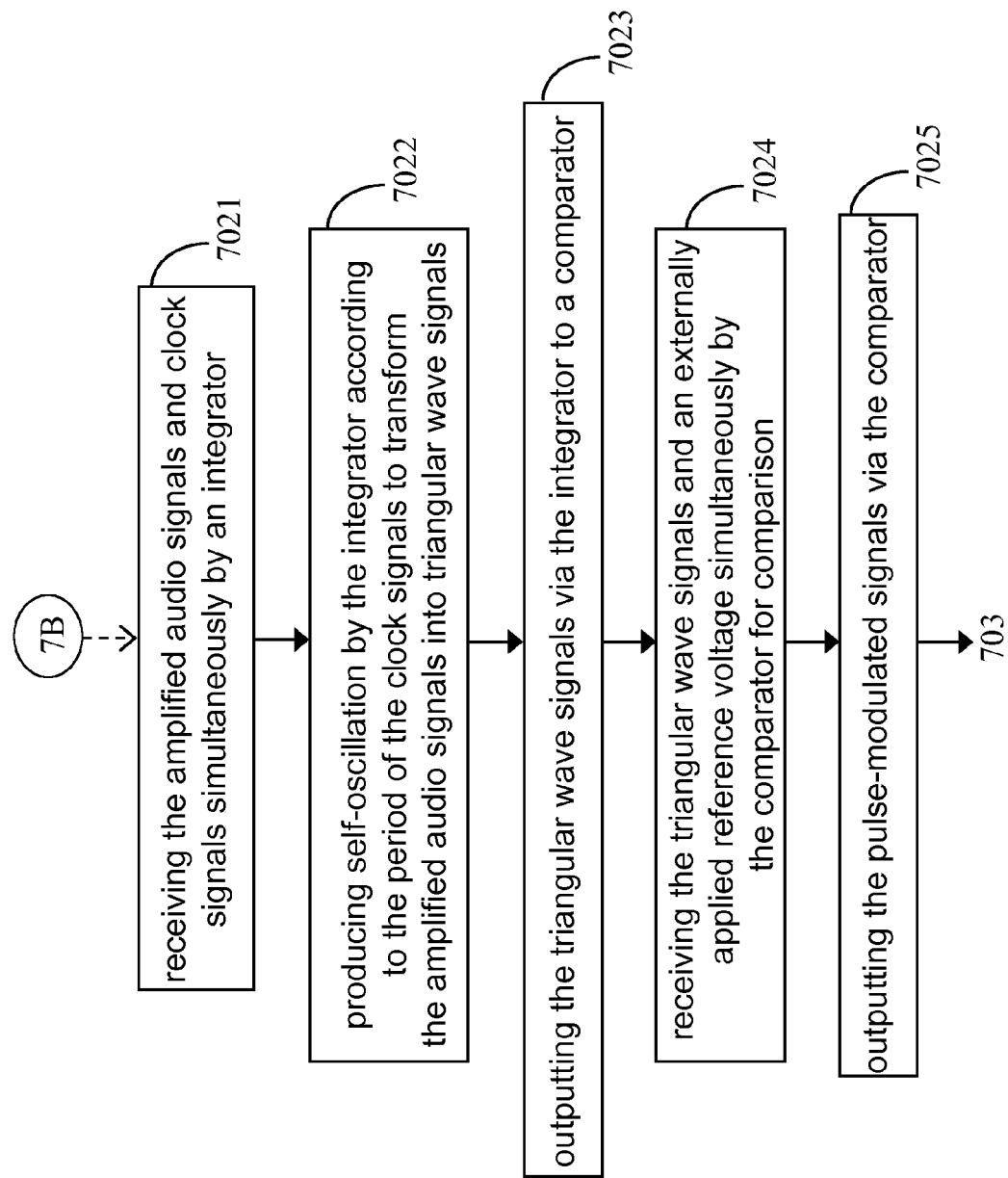
FIG. 9 is a detailed flowchart of step (702) according to the present invention.

Referring to FIG. 9, there is shown a detailed flowchart of step (702), which further comprises the following steps.

Firstly in step (7021), the integrator 31 receives the amplified audio signals and the clock signals at the same time. Next in step (7022), the integrator 31 produces self-oscillation according to the period of the clock signals to transform the amplified audio signals into the triangular wave signals, and in step (7023), the integrator 31 outputs the triangular wave signals to the comparator 32. In step (7024) following step (7023), the comparator 32 receives the triangular wave signals and the externally applied reference voltage VREF at the same time for comparison, and then in step (7025), the comparator 32 outputs the pulse-modulated signals. Afterwards, the method proceeds to step (703).

Figure 10:
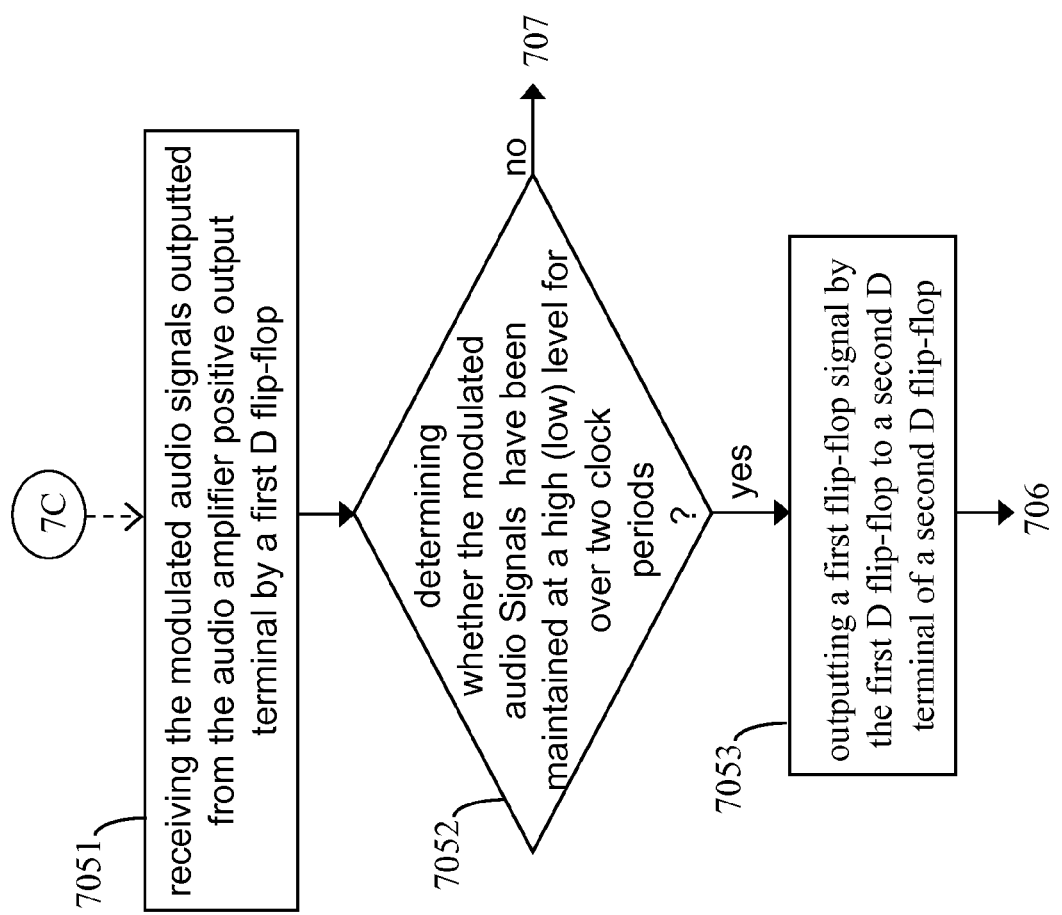
FIG. 10 is a detailed flowchart of step (705) according to the present invention.

Referring next to FIG. 10, there is shown a detailed flowchart of step (705), which further comprises the following steps.

Firstly in step (7051), the first D flip-flop 611 receives the modulated audio signals outputted from the audio amplifier positive output terminal Out. Next in step (7052), it is determined whether the modulated audio signals is maintained at the high (low) level for over two clock periods. If yes, then in step (7053), the first D flip-flop 611 outputs the first flip-flop signal to the second D terminal 6121 of the second D flip-flop 612, and then the method proceeds to step (706); otherwise, the method proceeds to step (707).

Figure 11:
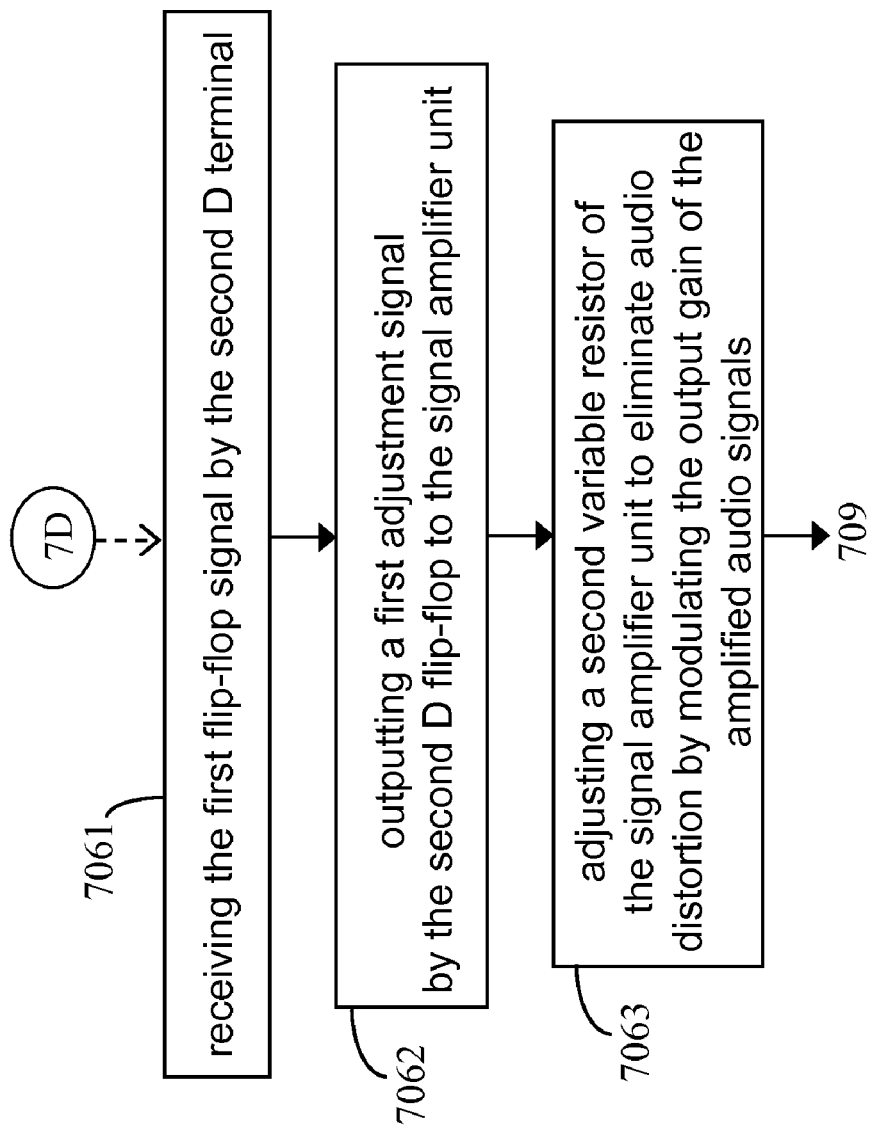
FIG. 11 is a detailed flowchart of step (706) according to the present invention.

Referring next to FIG. 11, there is shown a detailed flowchart of step (706), which further comprises the following steps.

Firstly in step (7061), the second D terminal 6121 receives the first flip-flop signal. Next in step (7062), the second D flip-flop 612 outputs the first adjustment signal to the signal amplifier unit 2, and in step (7063), the second variable resistor RV2 of the signal amplifier unit 2 is adjusted to eliminate audio distortion by modulating the output gain of the amplified audio signals. Afterwards, the method proceeds to step (709).

Figure 12:
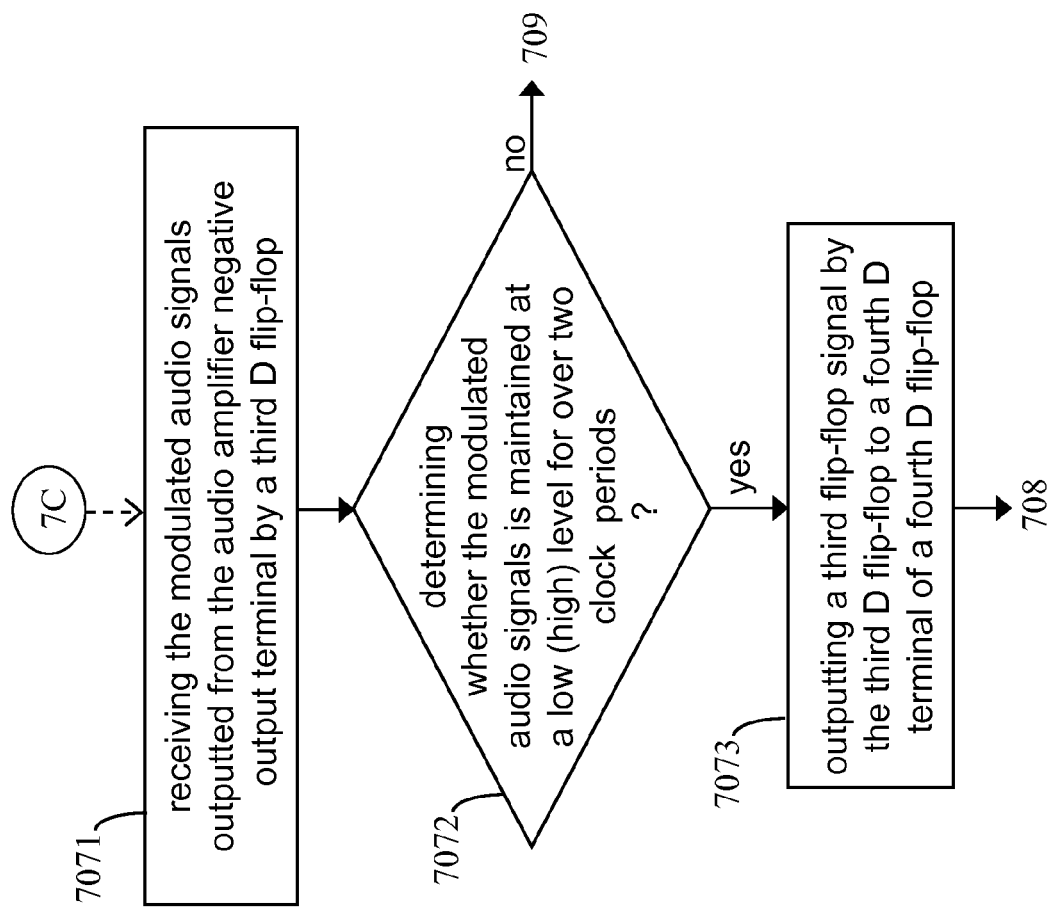
FIG. 12 is a detailed flowchart of step (707) according to the present invention.

Referring next to FIG. 12, there is shown a detailed flowchart of step (707), which further comprises the following steps.

Firstly in step (7071), the third D flip-flop 621 receives the modulated audio signals outputted from the audio amplifier negative output terminal Out. Next in step (7072), it is determined whether the modulated audio signals is maintained at the low (high) level for over two clock periods. If yes, then the method proceeds to step (7073) where the third D flip-flop 621 outputs the third flip-flop signal to the fourth D terminal 6221 of the fourth D flip-flop 622 and the method proceeds to step (708); otherwise, it means that the modulated audio signals are not distorted, in which case the method proceeds directly to step (709) where the modulated audio signals are outputted via the audio amplifier positive output terminal Out and the audio amplifier negative output terminal Outb to drive the speaker 120.

Figure 13:
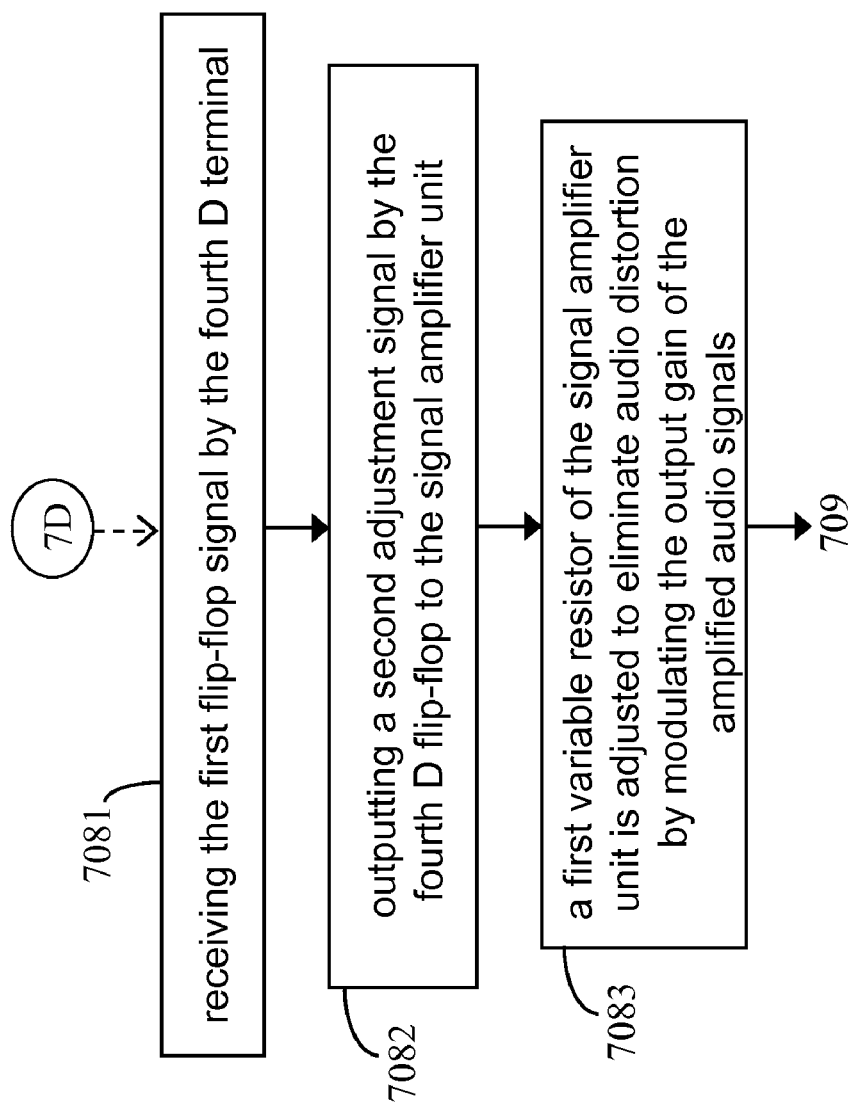
FIG. 13 is a detailed flowchart of step (708) according to the present invention.

Referring next to FIG. 13, there is shown a detailed flowchart of step (708), which further comprises the following steps.

Firstly in step (7081), the fourth D terminal 6221 receives the first flip-flop signal. Next in step (7082), the fourth D flip-flop 622 outputs the second adjustment signal to the signal amplifier unit 2, and in step (7083), the first variable resistor RV1 of the signal amplifier unit 2 is adjusted to eliminate audio distortion by modulating the output gain of the amplified audio signals. Afterwards, the method proceeds to step (709).

Thus, the improved self-oscillation audio amplifier and the method for restraining distortion of the improved self-oscillation audio amplifier have been described clearly. In summary, the present invention offers the following advantages over conventional power amplifiers:

1. by using the distortion restraint unit in the self-oscillation audio amplifier, the present invention is able to monitor whether distortion occurs in the audio signals outputted from the self-oscillation audio amplifier. If distortion occurs in the outputted audio signals, the audio distortion can be restrained effectively by the distortion restraint unit immediately; and
2. according to the method for restraining distortion of the improved self-oscillation audio amplifier of the present invention, the flip-flop set is used to determine whether the audio signals outputted from the audio amplifier output terminal is distorted and two D flip-flops connected in series of the flip-flop set are used to restrain distortion of the audio signals outputted from the audio amplifier, thereby maintaining a high-quality output of the speaker.

What is claimed is:
1. A improved self-oscillating audio amplifier, comprising:
a signal amplifier unit, being coupled to an audio source to receive and amplify audio signals into amplified audio signals;
at least one self-oscillation modulation unit, being coupled to the signal amplifier unit to receive the amplified audio signals and configured to perform pulse modulation on the amplified audio signals in a self-oscillating way to output pulse-modulated signals;
at least one gate drive unit, being coupled to the at least one self-oscillation modulation unit to receive the pulse-modulated signals and configured to control the on/off status of the circuit of the next stage according to the pulse-modulated signals;
at least one output stage transistor set, being coupled to the gate drive unit, wherein the gate drive unit receives the pulse-modulated signals outputted by the self-oscillation modulation unit and, according to the pulse-modulated signals, controls the on/off status of the output stage transistor set so that the output stage transistor set outputs modulated audio signals;
an audio amplifier positive output terminal, being coupled to the output stage transistor set to receive the modulated audio signals and drive a speaker;
an audio amplifier negative output terminal, being coupled to the output stage transistor set to receive the modulated audio signals and to drive the speaker; and
a distortion restraint unit, being coupled to the audio amplifier positive output terminal, the audio amplifier negative output terminal and the signal amplifier unit, and being configured to detect whether the modulated audio signals outputted by the output stage transistor set to the audio amplifier positive output terminal and the audio amplifier negative output terminal is distorted and, if distorted, restrain the distortion, the distortion restraint unit comprising:

a first flip-flop set, being coupled to the audio amplifier positive output terminal and the signal amplifier unit and configured to receive the modulated audio signals outputted by the output stage transistor set to the audio amplifier positive output terminal, wherein when the modulated audio signals have been maintained at a high/low level for over two clock periods, the first flip-flop set outputs a first adjustment signal to the signal amplifier unit according to the characteristic response thereof to adjust an output gain of the amplified audio signal; and a second flip-flop set, being coupled to the audio amplifier negative output terminal and the signal amplifier unit and configured to receive the modulated audio signals outputted by the output stage transistor set to the audio amplifier negative output terminal, wherein when the modulated audio signals have been maintained at a low/high level for over two clock periods, the second flip-flop set outputs a second adjustment signal to the signal amplifier unit according to the characteristic response thereof to adjust the gain of the amplified audio signals.

2. The improved self-oscillating audio amplifier of claim 1, further comprising:

two feedback resistors, one of which is coupled between the audio amplifier positive output terminal and the self-oscillation modulation unit while the other is coupled between the audio amplifier negative output terminal and self-oscillation modulation unit, wherein the two feedback resistors are configured to help in feeding back signals to the self-oscillation modulation unit; and a clock unit, being coupled to the distortion restraint unit to provide the clock signals.

3. The improved self-oscillating audio amplifier of claim 1, wherein the signal amplifier unit further comprises:

a fully differential amplifier, comprising a differential amplifier positive input terminal, a differential amplifier negative input terminal, a differential amplifier positive output terminal and a differential amplifier negative output terminal, wherein the differential amplifier positive input terminal and the differential amplifier negative input terminal are coupled to the audio source to receive the audio signals while the differential amplifier positive output terminal and the differential amplifier negative output terminal are coupled to the self-oscillation modulation unit, and the fully differential amplifier is configured to amplify the audio signals to output the amplified audio signals to the self-oscillation modulation unit;

a first variable resistor, being coupled between the differential amplifier positive input terminal and the differential amplifier negative output terminal and, by adjusting resistance of the first variable resistor, the output gain of the amplified audio signals outputted by the differential amplifier negative output terminal is modulated; and a second variable resistor, being coupled between the differential amplifier negative input terminal and the differential amplifier positive output terminal, and by adjusting resistance of the second variable resistor, the output gain of the amplified audio signals outputted by the differential amplifier positive output terminal is modulated.

4. The improved self-oscillating audio amplifier of claim 1, wherein the self-oscillation modulation unit further comprises:

an integrator, being connected to the signal amplifier unit to receive the amplified audio signals and configured to generate self-oscillation for transforming the amplified audio signals into triangular wave signals, the integrator comprising:

an integrator resistor, being coupled to the signal amplifier unit for acting as a buffer interface of inputting the amplified audio signals into the integrator;

an integrator capacitor, being coupled to the integrator resistor and configured to be charged and discharged when the amplified audio signals being inputted into the integrator via the integrator resistor; and an operational amplifier, comprising an operational amplifier positive input terminal, an operational amplifier negative input terminal and an operational amplifier output terminal, wherein the operational amplifier positive input terminal is coupled to an externally applied reference voltage, and the operational amplifier negative input terminal is coupled to the integrator resistor, and wherein when the integrator capacitor is charged and discharged repeatedly, the triangular wave signals in a periodic nature are outputted by the operational amplifier; and a comparator, comprising a comparator positive input terminal, a comparator negative input terminal and a comparator output terminal, the comparator positive input terminal being coupled to the operational amplifier output terminal, the comparator negative input terminal being coupled to the externally applied reference voltage, and the comparator output terminal being coupled to the gate drive unit, wherein upon receiving the triangular wave signals, the comparator compares the triangular wave signals against the externally applied reference voltage and outputs the pulse-modulated signals to the gate drive unit.

5. The improved self-oscillating audio amplifier of claim 1, wherein the first flip-flop set further comprises:

a first D flip-flop, comprising a first D terminal, a first CK terminal, a first Q terminal, a first Qb terminal and a first R terminal, the first D terminal being coupled to an externally applied operation voltage, the first CK terminal being coupled to the clock signals, the first Qb terminal being in the floating status, and the first R terminal being coupled to the audio amplifier positive output terminal to receive the modulated audio signals outputted by the output stage transistor set to the audio amplifier positive output terminal, wherein when the modulated audio signals have been maintained at a high/low level for over two clock periods, the first D flip-flop outputs, according to the characteristic response thereof, a first flip-flop signal to the circuit of the next stage; and a second D flip-flop, comprising a second D terminal, a second CK terminal, a second Q terminal, a second Qb terminal and a second R terminal, the second D terminal being coupled to the first Q terminal of the first D flip-flop to receive the first flip-flop signal, the second CK terminal being coupled to the clock signals, the second Q terminal being coupled to the signal amplifier unit, the second Qb terminal being in a floating status, and the second R terminal being coupled to the audio amplifier positive output terminal to receive the modulated audio signals, wherein when the modulated audio signal have been maintained at a high/low level for over two clock periods, the first flip-flop signal outputted from the first Q terminal is received at the second R terminal, and then the second D flip-flop outputs, according to the characteristic response thereof, the first adjustment signal for feedback to the signal amplifier unit to adjust the output gain of the amplified audio signals, thereby eliminating the audio distortion.

6. The improved self-oscillating audio amplifier of claim 1, wherein the second flip-flop set further comprises:
   a third D flip-flop, comprising a third D terminal, a third CK terminal, a third Q terminal, a third Qb terminal and a third R terminal, the third D terminal being coupled to an externally applied operation voltage, the third CK terminal being coupled to the clock signals, the third Qb terminal being in a floating status, and the third R terminal being coupled to the audio amplifier negative output terminal to receive the modulated audio signals outputted by the output stage transistor set to the audio amplifier negative output terminal, wherein when the modulated audio signals have been maintained at a low/high level for over two clock periods, the third D flip-flop outputs, according to the characteristic response thereof, a third flip-flop signal to the circuit of the next stage; and
   a fourth D flip-flop, comprising a fourth D terminal, a fourth CK terminal, a fourth Q terminal, a fourth Qb terminal and a fourth R terminal, the fourth D terminal being coupled to the third Q terminal of the third D flip-flop to receive the third flip-flop signal, the fourth CK terminal being coupled to the clock signals, the fourth Q terminal being coupled to the signal amplifier unit, the fourth Qb terminal being in a floating status, and the fourth R terminal being coupled to the audio amplifier negative output terminal to receive the modulated audio signals, wherein when the modulated audio signals have been maintained at a low/high level for over two clock periods, the third flip-flop signal outputted from the third Q terminal is received at the fourth R terminal, and then the fourth D flip-flop outputs, according to the characteristic response thereof, the second adjustment signal for feedback to the signal amplifier unit to adjust the output gain of the amplified audio signal, thereby eliminating the audio distortion.

7. A method for restraining audio distortion of a self-oscillating audio amplifier, comprising the following steps of:
   (1) receiving and amplifying audio signals by a signal amplifier unit;
   (2) receiving amplified audio signals by a self-oscillation modulation unit to perform pulse modulation;
   (3) receiving pulse-modulated signals from the self-oscillation modulation unit by a gate drive unit to control an output stage transistor set;
   (4) outputting modulated audio signals by the output stage transistor set to an audio amplifier positive output terminal and an audio amplifier negative output terminal;
   (5) determining whether the modulated audio signals outputted from the audio amplifier positive output terminal is distorted by a first flip-flop set, and if yes, proceeding to step (6), and otherwise, proceeding to step (7);
   (6) restraining distortion of the modulated audio signals outputted from the audio amplifier positive output terminal, and proceeding to step (9);
   (7) determining whether the modulated audio signals outputted from the audio amplifier negative output terminal is distorted by a second flip-flop set, and if yes, proceeding to step (8), and otherwise, proceeding to step (9);
   (8) restraining distortion of the modulated audio signals outputted from the audio amplifier negative output terminal; and
   (9) outputting the modulated audio signals by the audio amplifier positive output terminal and the audio amplifier negative output terminal for driving a speaker.

8. The method of claim 7, wherein the step (1) further comprises the following steps of:
   (11) receiving the audio signals by a fully differential amplifier;
   (12) amplifying the audio signals through the fully differential amplifier; and
   (13) outputting the amplified audio signals via the fully differential amplifier.

9. The method of claim 7, wherein the step (2) further comprises the following steps of:
   (21) receiving the amplified audio signals and clock signals simultaneously by an integrator;
   (22) producing self-oscillation by the integrator according to the period of the clock signals to transform the amplified audio signals into triangular wave signals;
   (23) outputting the triangular wave signals via the integrator to a comparator;
   (24) receiving the triangular wave signals and an externally applied reference voltage simultaneously by the comparator for comparison; and
   (25) outputting the pulse-modulated signals via the comparator.

10. The method of claim 7, wherein the step (5) further comprises the following steps of:
    (51) receiving the modulated audio signals outputted from the audio amplifier positive output terminal by a first D flip-flop;
    (52) determining whether the modulated audio signals have been maintained at a high (low) level for over two clock periods, and if yes, proceeding to step (53), and otherwise, proceeding to the step (7); and
    (53) outputting a first flip-flop signal by the first D flip-flop to a second D terminal of a second D flip-flop.

11. The method of claim 10, wherein the step (6) further comprises the following steps of:
    (61) receiving the first flip-flop signal by the second D terminal;
    (62) outputting a first adjustment signal by the second D flip-flop to the signal amplifier unit; and
    (63) adjusting a second variable resistor of the signal amplifier unit to eliminate audio distortion by modulating the output gain of the amplified audio signals.

12. The method of claim 7, wherein the step (7) further comprises the following steps of:
    (71) receiving the modulated audio signals outputted from the audio amplifier negative output terminal by a third D flip-flop;
    (72) determining whether the modulated audio signals is maintained at a low (high) level for over two clock periods, and if yes, proceeding to step (73), and otherwise, proceeding to the step (9); and
    (73) outputting a third flip-flop signal by the third D flip-flop to a fourth D terminal of a fourth D flip-flop.

13. The method of claim 12, wherein the step (8) further comprises the following steps of:
    (81) receiving the first flip-flop signal by the fourth D terminal;
    (82) outputting a second adjustment signal by the fourth D flip-flop to the signal amplifier unit; and
    (83) a first variable resistor of the signal amplifier unit is adjusted to eliminate audio distortion by modulating the output gain of the amplified audio signals.

* * * * *